(12) United States Patent
Kennedy et al.

(10) Patent No.: US 7,107,024 B2
(45) Date of Patent: Sep. 12, 2006

(54) FM MODULATOR OUTPUT CONTROL DURING TURN ON

(75) Inventors: John F. Kennedy, Dearborn, MI (US); Edmund J. Tillo, Belleville, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 413 days.

(21) Appl. No.: 10/611,742

(22) Filed: Jul. 1, 2003

(65) Prior Publication Data
US 2005/0003788 A1 Jan. 6, 2005

(51) Int. Cl.
*H04B 1/10* (2006.01)
(52) U.S. Cl. ............... 455/114.2; 455/119; 381/7
(58) Field of Classification Search ........ 455/215–225, 455/114.2, 127.2, 119; 332/132; 381/3, 381/7
See application file for complete search history.

(56) References Cited

U.S. PATENT DOCUMENTS

| | | | |
|---|---|---|---|
| 4,140,960 A | 2/1979 | Ohsawa | |
| 4,600,947 A | 7/1986 | Chamberlain et al. | |
| 4,991,212 A | 2/1991 | Foti | |
| 5,204,904 A | 4/1993 | Carver et al. | |
| 5,255,094 A | 10/1993 | Yong et al. | |
| 5,422,955 A | 6/1995 | Guzman et al. | |
| 5,642,076 A | 6/1997 | Naokawa et al. | |
| 5,969,561 A * | 10/1999 | McGillan | 327/308 |
| 6,075,412 A * | 6/2000 | Bainvoll | 330/149 |
| 6,163,711 A | 12/2000 | Juntunen et al. | |
| 6,324,385 B1 * | 11/2001 | Nagano et al. | 455/76 |
| 6,346,854 B1 | 2/2002 | Heithoff | |
| 6,445,732 B1 * | 9/2002 | Beamish et al. | 375/224 |
| 6,448,857 B1 * | 9/2002 | Quintanar et al. | 330/289 |
| 2003/0012389 A1 * | 1/2003 | Brice et al. | 381/86 |

FOREIGN PATENT DOCUMENTS

| | | |
|---|---|---|
| JP | 58075332 | 5/1983 |
| JP | 2000013253 | 1/2000 |
| JP | 2000013253 A | 1/2000 |

* cited by examiner

*Primary Examiner*—Nguyen T. Vo
*Assistant Examiner*—Adeel Haroon
(74) *Attorney, Agent, or Firm*—Brinks Hofer Gilson & Lione

(57) ABSTRACT

The present invention provides a system and a method to prevent undesired sounds during FM modulator turn on. The system includes an RF attenuator circuit, a delay switch circuit, an RF ramp up circuit, and audio ramp up circuit. The RF attenuator circuit significantly reduces the RF signal from the FM modulator when the FM modulator is initially turned on, which significantly reduce whistle caused by the RF signal from the modulator beating with the local oscillator in the radio receiver. After allowing time for the PLL to lock onto the RF signal, the time delay switch circuit becomes active and charges the RF ramp up circuit. The RF ramp up circuit gradually increases the RF signal by gradually deactivating the RF attenuator circuit. The gradual increase of the RF signal is slower than the response time of the radio AGC, thereby preventing any pop as the RF signal is provided to the radio receiver.

21 Claims, 2 Drawing Sheets

FM MODULATOR OUTPUT CONTROL DURING TURN ON

BACKGROUND

1. Field of the Invention

The present invention generally relates to an FM modulator. More specifically, the invention relates to a system for reducing undesirable sounds associated with the FM modulator turn on.

2. Description of Related Art

One application of an FM modulator includes modulating stereophonic composite audio signals from peripheral devices such as, DVD players, allowing the resulting RF signal to be played by a standard stereo radio receiver. The ability to use peripheral devices with a standard radio receiver can provide a significant cost savings for automotive applications. However, it is recognized that a certain set of chirps and pops are created in association with FM modulator turn on. These sounds are annoying and distracting to most consumers.

One undesired sound is an annoying whistle from high to low-frequency. FM modulators employ a phase lock loop (PLL) which facilitates selection and precise control of frequency of the FM modulator output signal. While the operating frequency is precisely controlled, there is a time interval just after FM modulator turn on that the RF output frequency sweeps over some wide range. The whistle is due to the heterodyning of the sweeping RF output signal of the FM modulator with the local oscillator of the vehicle radio receiver. Therefore, the whistle is present shortly after FM modulator turn on, and stops once the FM modulator PLL is locked onto the operating frequency of the FM modulator.

Additionally, popping sounds are created when the RF level input to a radio receiver changes abruptly, such that the change in the RF input level occurs faster than the response time of the vehicle radio receiver AGC system. For example, if the RF level is switched on very quickly, the AGC of the receiver will not be able to track the input signal, therefore the end result will be a large amplitude popping sound.

Sudden sounds including pops, whistles and abrupt volume changes are especially noticeable to the consumer when associated with a particular event such as turning on a radio. Consumers perceive pops and whistles as being indicative of a poor quality radio, thereby making the sounds highly undesirable for manufacturers.

In view of the above, it is apparent that there exists a need to eliminate undesired sounds during FM modulator turn on. Satisfying that need is one of the primary objects of the present invention.

SUMMARY

In satisfying the above need, as well as overcoming the enumerated drawbacks and other limitations of the related art, the present invention provides a system and a method to prevent undesired sounds during FM modulator turn on, including initial power up, frequency tuning, and audio output.

The system includes an RF attenuator circuit, a delay switch circuit, an RF ramp up circuit, and audio ramp up circuit. The RF attenuator circuit significantly reduces the RF signal from the FM modulator when the FM modulator is initially turned on. Attenuating the RF signal significantly reduces the whistle caused by the heterodyning of the RF signal of the FM modulator with the local oscillator contained in the vehicle radio receiver. Meanwhile, the PLL of the FM modulator is still able to precisely lock on to the selected radio frequency. Once the PLL if the FM modulator is locked onto the selected frequency, the heterodyning of the RF output of the FM modulator and the local oscillator of the vehicle radio receiver can no longer occur, thereby eliminating the possibility of a whistle. The time interval that the RF attenuator is activated is controlled by the delay switch circuit. After allowing time for the FM modulator PLL to lock onto the selected radio frequency signal, the time delay switch activates the RF ramp up circuit. The RF ramp up circuit gradually increases the FM modulator RF output signal level by gradually deactivating the RF attenuator circuit. The gradual increase of the RF level of the modulator output is intentionally slower than the response time of the vehicle radio receiver AGC system, thus allowing the radio vehicle AGC system to follow the RF signal level from the FM modulator RF output, thereby eliminating any popping sounds at the output of the vehicle radio receiver as the RF signal from the FM modulator is provided to the radio receiver.

As the time delay switch is activated a capacitor in the audio ramp up circuit is charged. As a result of the increasing voltage on this capacitor, the audio ramp up circuit gradually increases the stereo composite signal fed into the FM modulator input, thus eliminating sudden changes in the audio output of the vehicle radio receiver.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 1 is an electrical schematic of a system according to the present invention to reduce undesired noises during FM modulator turn-on.

DETAILED DESCRIPTION

Figure 1:
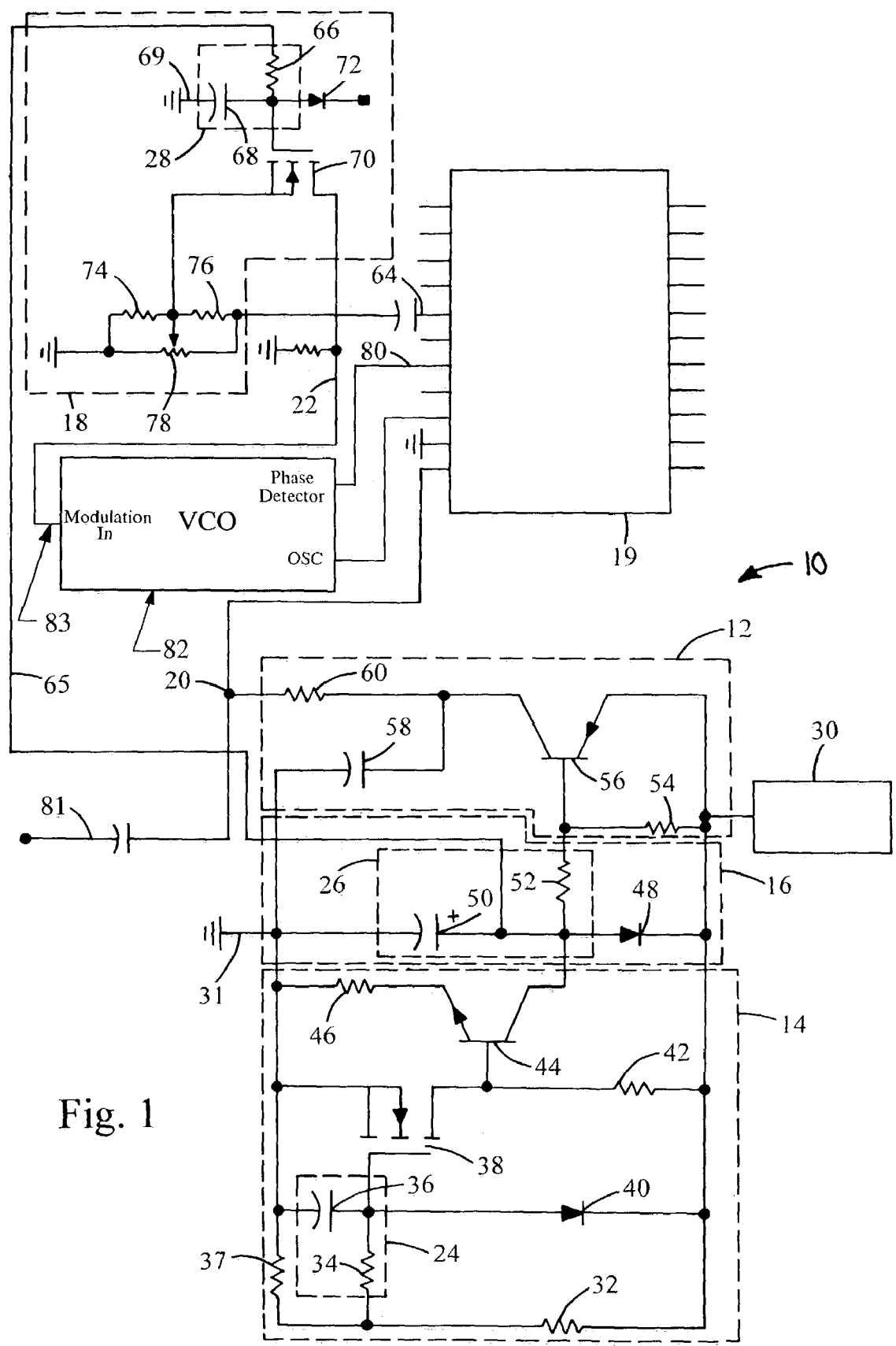
Figure 2:
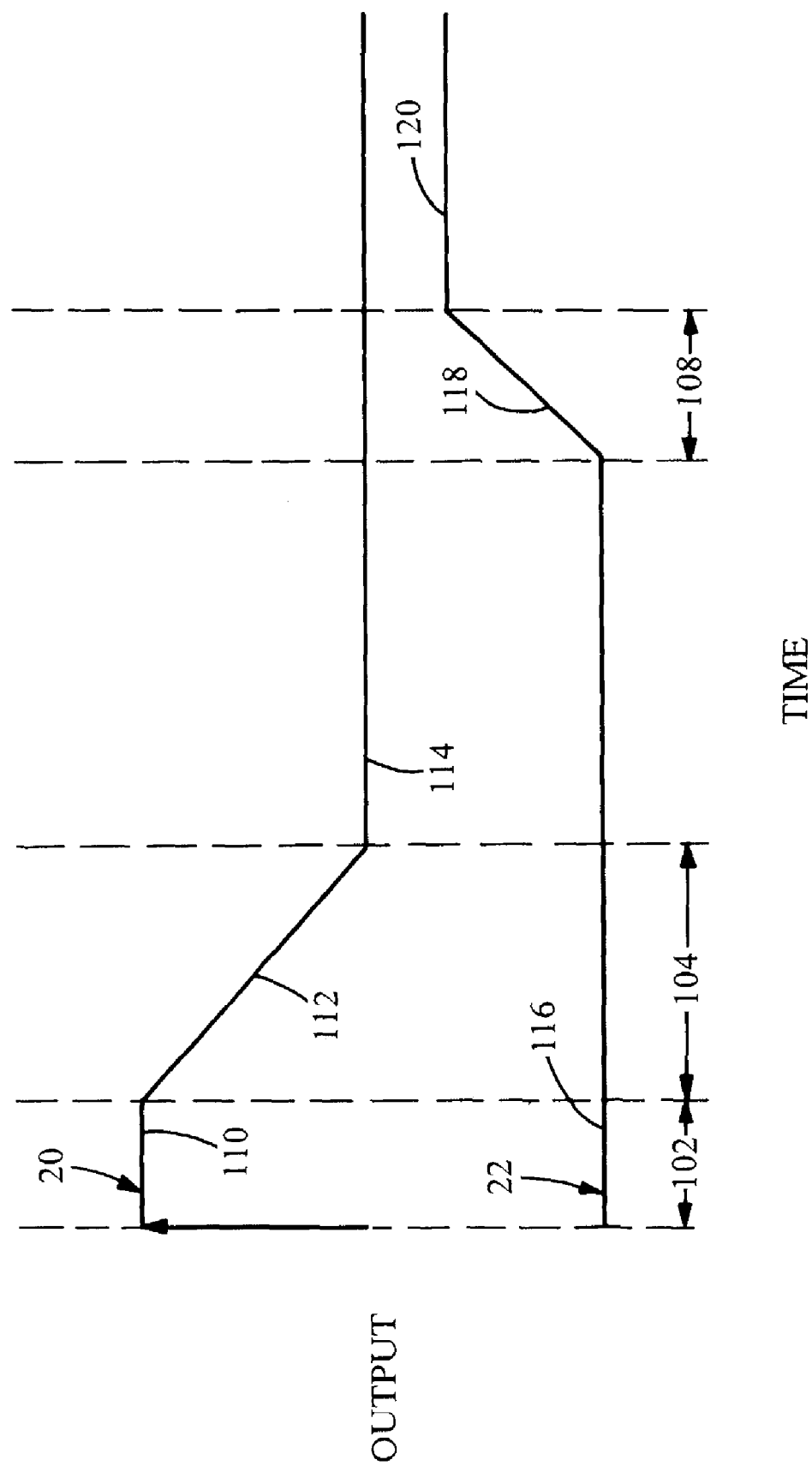
FIG. 2 is a timing diagram showing the RF signal output and audio signal output of the system according to the present invention.

Now referring to FIGS. 1 and 2, a system embodying the principles of the present invention is illustrated therein and designated at 10. As its primary components, the system 10 includes a RF attenuator circuit 12, a delay switch 14, a RF ramp-up circuit 16, and an audio ramp-up circuit 18. As the FM modulator turns on, the voltage source 30 creates a positive voltage. The positive voltage immediately turns on the RF attenuator circuit 12, forcing the RF signal on lead 20, connected to the radio receiver input on 64, to minimum level, 30 dB below nominal level, 110.

Included in the attenuator circuit 12, resistor 54 is connected between the voltage source 30 and the base of the PNP transistor 56. The base of transistor 56 is connected through resistor 52 to capacitor 50. Capacitor 50 is initially discharged, and thus the base of PNP transistor 56 is held low. The low voltage on the base of PNP transistor 56 allows the transistor 56 to fully saturate, applying a positive voltage to resistor 60 connected between the collector of PNP transistor 56 and the RF signal lead 20 from a combiner/modulator circuit 19. As a result, the RF output lead 20 is pulled high resulting in an attenuation of the RF signal level on lead 20 by about 30 dB, shown as the minimum RF output 110 in FIG. 2. To provide an AC ground at the output of PNP transistor 56; the capacitor 58 is connected between electrical ground 31 and resistor 60. Combiner/modulator circuits are commercially available, one such integrated circuit is BH1417F available from multiple suppliers.

As the voltage source 30 initially turns on, it also provides a positive voltage to the time delay circuit 14. Resistor 42 is connected between the voltage source 30 and the base of NPN transistor 44. The positive voltage on resistor 42 forces transistor 44 to conduct shunting any current through resistor 52 to electrical ground 31. Shunting current from resistor 52 to ground 31 keeps the voltage across capacitor 50 low, and the RF ramp-up circuit 16 deactivated.

Resistor 32 is connected between the voltage source 30 and the resistor-capacitor (RC) pair 24. The resistor 37 is connected between the RC pair 24 and electrical ground 31. Resistors 32 and 37 result in a positive voltage being applied to resistor 34 of the RC pair 24. Capacitor 36 is connected between the gate of MOSFET 38 and electrical ground 31. Resistors 34, 37, and 32 work in cooperation with capacitor 36 to create a delay 102 from power on to the turn-on of MOSFET 38. For the embodiment shown, the delay is about 0.4 seconds. The delay 102 allows the PLL of combiner/modulator 19 to lock onto the selected precise frequency while the signal 20 is attenuated, thereby eliminating any whistle caused by the heterodyning of the RF signal on lead 20 from the FM modulator and the local oscillator of the vehicle radio receiver attached to 81.

The source of MOSFET 38 is connected to electrical ground 31 and the drain of MOSFET 38 is connected to the base of transistor 44. When MOSFET 38 turns on, transistor 44 is forced into the off state. The collector of transistor 44 is connected to RC pair 26. When transistor 44 stops conducting, capacitor 50 of the RC pair 26 begins charging. Resistor 52 is connected between the collector of transistor 44 and the base of PNP transistor 56. The capacitor 50 is connected between the collector of transistor 44 and the electrical ground 31. The charging of capacitor 50 through resistor 52 gradually turns off PNP transistor 56. As seen in FIG. 2, the gradual turn-off of PNP transistor 56 creates a transition 112 of RF signal 20 from the minimum RF output 110 to the maximum RF output 114. For the embodiment shown, the transition 112 happens over a time period 104 of about 1.5 seconds. The gradual transition 112 allows the RF signal on lead 20 to increase at a rate slower than the response time of the AGC of the vehicle radio receiver attached to lead 81 thereby eliminating popping noises caused by increasing the RF signal level on lead 20.

The RC pair 26 of the RF ramp-up circuit 16 is also connected to the audio ramp-up circuit 18 across line 65. Resistor 66 is connected between line 65 and the gate of MOSFET 70. Capacitor 68 is connected between the gate of the MOSFET 70 and an electrical ground 69. The resistor 66 and capacitor 68 cooperate to form an RC pair 28. Initially, capacitor 68 is discharged, and MOSFET 70 is in the off state. The charging of capacitor 68 in RC pair 28 gradually increases the composite output signal 22 by gradually turning on the MOSFET 70. As MOSFET 70 turns on, composite output signal 22 transitions from no composite output 116 through a ramp-up 118 to the maximum composite output 120. The time period 108 of the ramp-up transition 118 is determined by the values of the resistor 66 and capacitor 68 of the RC pair 28. For the embodiment shown, time period 108 is about 2.0 seconds, which eliminates any pops caused by increasing the composite output 22 to the modulation input 83 of voltage controlled oscillator (VCO) 82. The composite signal output 64 from the combiner/modulator 19 is connected to a voltage divider including resistor 76, resistor 74, and variable resistor 78. As MOSFET 70 begins conducting, the audio composite output signal is provided from the drain of MOSFET 70 to the composite input 83 of the VCO 82. Diodes 40, 48 and 72 are provided to discharge capacitor 36 in the delay switch circuit, capacitor 50 in the RF ramp up circuit, and capacitor 6 in the audio ramp up circuit respectively, when the FM modulator is eventually turned off.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A system adapted to eliminate undesired sounds during turn on of a FM modulator, the FM modulator having a RF output signal in communication with a radio receiver, a VCO modulation input, and a composite output signal, the system comprising:

a RF attenuator circuit in communication with the RF output signal of the FM modulator and adapted to initially reduce the RF output signal;

a RF ramp up circuit in communication with the RF attenuator circuit and adapted to deactivate the RF attenuator circuit;

a delay switch circuit in communication with the RF ramp up circuit and adapted to delay activation of the RF ramp up circuit; and an audio ramp up circuit in communication with the RF ramp-up circuit and the composite output Signal at the FM modulator, the audio ramp up circuit increasing the composite output signal.

2. The system according to claim 1, the audio ramp up circuit including a resistor, a capacitor, and a transistor.

3. The system according to claim 1, the time delay switch circuit including a first and second transistor, a resistor, and a capacitor.

4. The system according to claim 3, wherein the second transistor is a NPN transistor.

5. The system according to claim 3, the NPN transistor having a base in communication with the second transistor, an emitter in communication with an electrical ground, and a collector in communication with the RF ramp-up circuit.

6. The system according to claim 3, wherein the second transistor is a field effect transistor, the gate of the field effect transistor being in communication with the resistor and the capacitor, the source of the field effect transistor being in communication with an electrical ground, and the drain of the field effect transistor being in communication with the first transistor.

7. A system adapted to eliminate undesired sounds during turn on of a FM modulator, the FM modulator having a RF output signal in communication with a radio receiver, a VCO modulation input, and a composite output signal, the system comprising:

a RF attenuator circuit in communication with the RF output signal of the FM modulator and adapted to initially reduce the RF output signal;

a RF ramp up circuit in communication with the RF attenuator circuit and adapted to deactivate the RF attenuator circuit; and a delay switch circuit in communication with the RF ramp up circuit and adapted to delay activation of the RF ramp up circuit; and wherein a first side of the resistor is in communication with the delay switch circuit, a second side of the resistor is in communication with the capacitor and the transistor, the capacitor being connected between the resistor and an electrical ground.

8. The system according to claim 7, the transistor of the audio ramp up circuit including a gate, a source, and a drain, wherein the gate is in communication with the resistor and the capacitor, the source is in connection with the composite output signal of the FM modulator, and the drain is in connection with the VCO modulation input.

9. A system adapted to eliminate undesired sounds during turn on of a FM modulator, the FM modulator having a RF output signal in communication with a radio receiver, a VCO modulation input, and a composite output signal, the system comprising:
 a RF attenuator circuit in communication with the RF output signal of the FM modulator and adapted to initially reduce the RF output signal;
 a RF ramp up circuit in communication with the RF attenuator circuit and adapted to deactivate the RF attenuator circuit; and
 a delay switch circuit in communication with the RF ramp up circuit and adapted to delay activation of the RF ramp up circuit, the RF attenuator circuit including a transistor, the transistor having a base, a collector, and an emitter; and
 wherein the emitter is connected to a power source, the base is in communication with the RF ramp up circuit, and a collector is in communication with the RF signal of the FM modulator.

10. The system according to claim 9, wherein the transistor is a PNP transistor.

11. The system according to claim 9, further comprising an audio ramp up circuit in communication with the delay switch circuit and the composite output of the FM modulator.

12. The system according to claim 11, the audio ramp up circuit including a resistor, a capacitor, and a second transistor.

13. The system according to claim 12, wherein a first side of the resistor is in communication with the delay switch circuit, a second side of the resistor is in communication with the capacitor and the second transistor, the capacitor being connected between the resistor and an electrical ground.

14. The system according to claim 13, the second transistor of the audio ramp up circuit including a gate, a source, and a drain, wherein the gate is in communication with the resistor and the capacitor, the source is in connection with the composite output signal of the FM modulator, and the drain is in connection with the VCO modulation input of the FM modulator.

15. The system according to claim 9, the RF ramp up circuit including a capacitor and a first resistor.

16. The system according to claim 15, wherein a first side of the capacitor is in communication with an electrical ground and a second side of the capacitor is in communication with the first resistor and the delay switch circuit, the first resistor being connected between a voltage source and the RF attenuator circuit.

17. The system according to claim 16, the RF ramp-up circuit including a second resistor, the second resistor being connected between the RF attenuator and the delay switch circuit.

18. The system according to claim 9, the time delay switch circuit including a second and third transistor, a resistor, and a capacitor.

19. The system according to claim 18, wherein the second transistor is a NPN transistor, the NPN transistor having a base in communication with the third transistor, a emitter in communication with an electrical ground, and a collector in communication with the RF ramp-up circuit.

20. The system according to claim 18, wherein the third transistor is a field effect transistor, the gate of the field effect transistor being in communication with the resistor and the capacitor, the source of the field effect transistor being in communication with an electrical ground, and the drain of the field effect transistor being in communication with the second transistor.

21. A system adapted to eliminate undesired sounds during turn on of a FM modulator, the FM modulator having a RF output signal in communication with a radio receiver, a VCO modulation input, and a composite output signal, the system comprising:
 a RF attenuator circuit in communication with the RF output signal of the FM modulator and adapted to initially reduce the RF output signal;
 a RF ramp up circuit in communication with the RF attenuator circuit and adapted to deactivate the RF attenuator circuit, the RF ramp up circuit including a capacitor and a first resistor;
 a delay switch circuit in communication with the RF ramp up circuit and adapted to delay activation of the RF ramp up circuit; and
 wherein a first side of the capacitor is in communication with an electrical ground and a second side of the capacitor is in communication with the first resistor and the delay switch circuit, the first resistor being connected between a voltage source and the RF attenuator circuit.

* * * * *